United States Patent [19]

Shinohe et al.

[11] Patent Number: 4,963,972
[45] Date of Patent: Oct. 16, 1990

[54] GATE TURN-OFF THYRISTOR WITH SWITCHING CONTROL FIELD EFFECT TRANSISTOR

[75] Inventors: Takashi Shinohe, Yokohama; Akio Nakagawa, Hiratsuka, both of Japan

[73] Assignee: Kabushiki Kaisha Toshiba, Kawasaki, Japan

[21] Appl. No.: 302,952

[22] Filed: Jan. 30, 1989

[30] Foreign Application Priority Data

Jan. 30, 1988 [JP] Japan .................................. 63-20304
Jun. 30, 1988 [JP] Japan ................................. 63-160880

[51] Int. Cl.⁵ .......................................... H01L 29/74
[52] U.S. Cl. ....................................... 357/38; 357/39; 357/23.4; 357/23.14
[58] Field of Search ................. 357/38, 39, 23.4, 23.14

[56] References Cited

U.S. PATENT DOCUMENTS

| | | | |
|---|---|---|---|
| 4,292,646 | 9/1981 | Assour et al. .......................... | 357/39 |
| 4,635,086 | 1/1987 | Miwa et al. . | |
| 4,748,492 | 5/1988 | Iwase et al. ....................... | 357/23.14 |
| 4,760,431 | 7/1988 | Nakagawa et al. ............... | 357/23.14 |

OTHER PUBLICATIONS

IEEE Transactions on Electron Devices, vol. ED-34, No. 2, 2/87, "Safe Operating Area for 1200-V Non-latchup Bipolar-mode MOSFET", by Nakagawa et al.
IEEE Transactions on Electron Devices, vol. ED-32, No. 3, Mar. 1985, pp. 594–598, S. Hachad, C. Cros, D. Darees, J. J. Dorkel, and P. Leturcq.

Primary Examiner—Rolf Hille
Assistant Examiner—Steven Loke
Attorney, Agent, or Firm—Oblon, Spivak, McClelland, Maier & Neustadt

[57] ABSTRACT

A gate turn-off thyristor is disclosed which includes a first emitter layer of a first type conductivity, a first base layer of a second type conductivity electrically connected to the first emitter layer, a second base layer of the first type conductivity formed in the surface of the first base layer, a second emitter layer of the second type conductivity formed in the second base layer, and a gate electrode insulatively provided to cover a portion of the second base layer positioned between the second emitter layer and the first base layer and having an elongated planar shape. A control electrode is electrically connected to the second base layer and turns off the thyristor in response to a turn-off controlling voltage signal externally supplied thereto. The control electrode comprises a first electrode portion insulatively provided above the gate electrode and having an elongated planar shape and a second electrode portion for electrically connecting the first electrode portion with the second base layer, and having a mesh-like planar pattern as a whole.

17 Claims, 11 Drawing Sheets

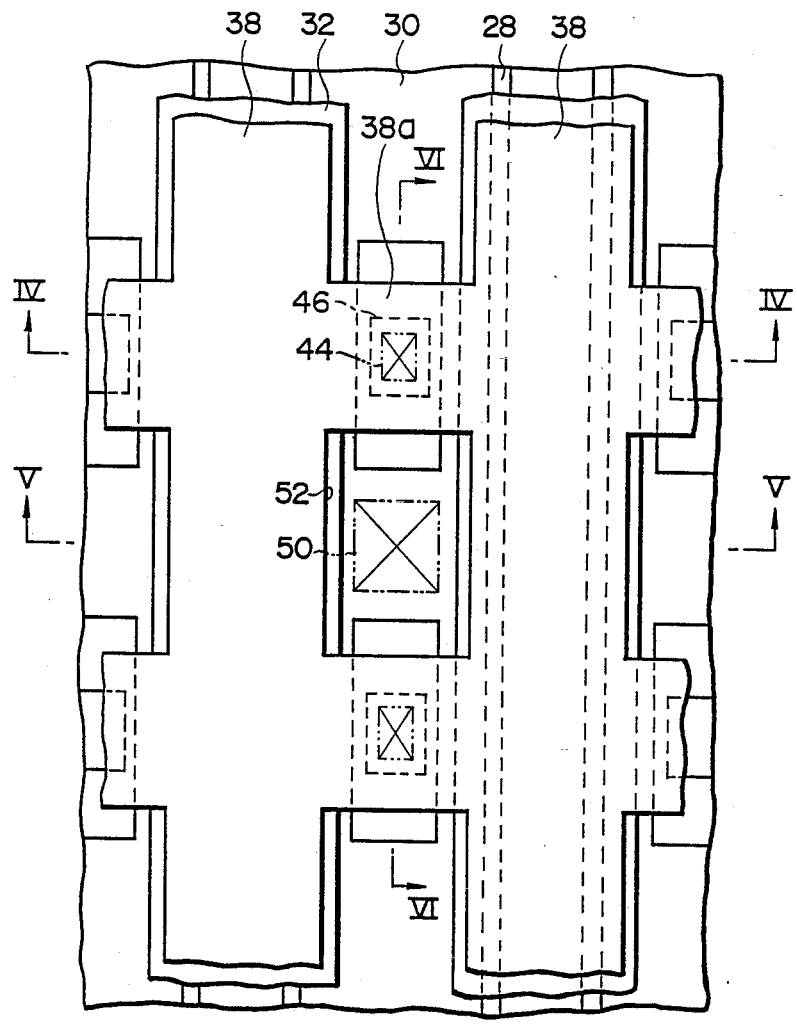
F I G. 3

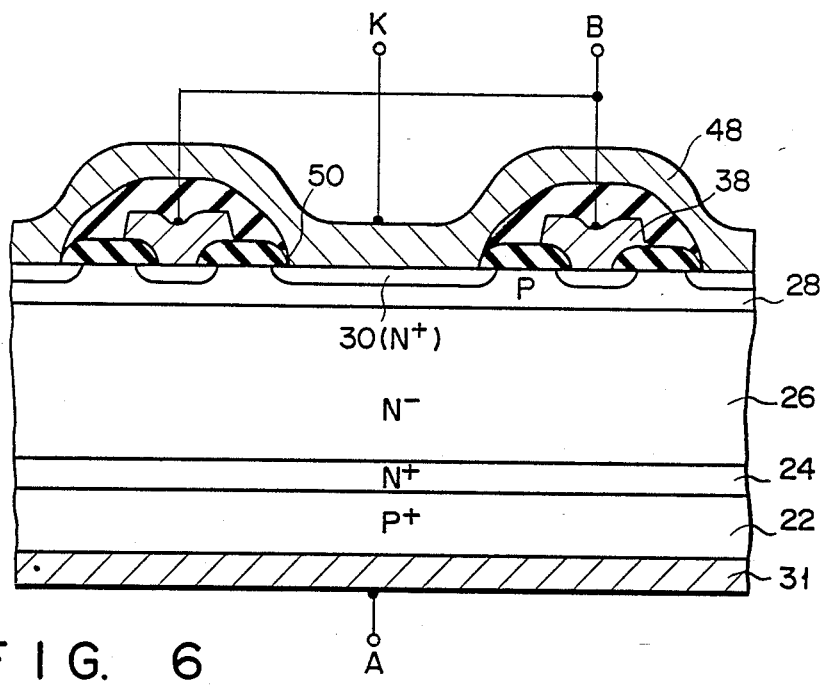
F I G. 6
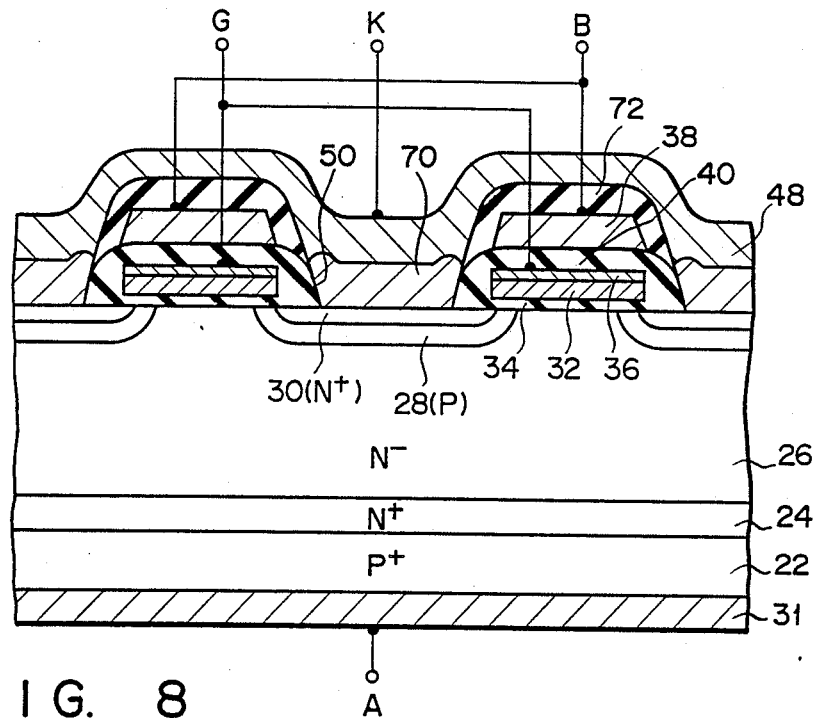
F I G. 8

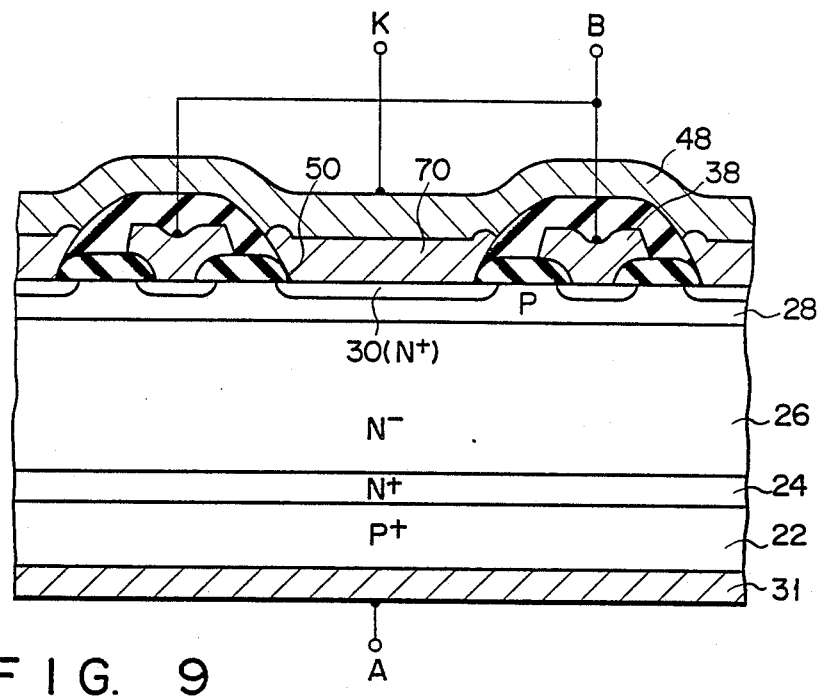
F I G. 9
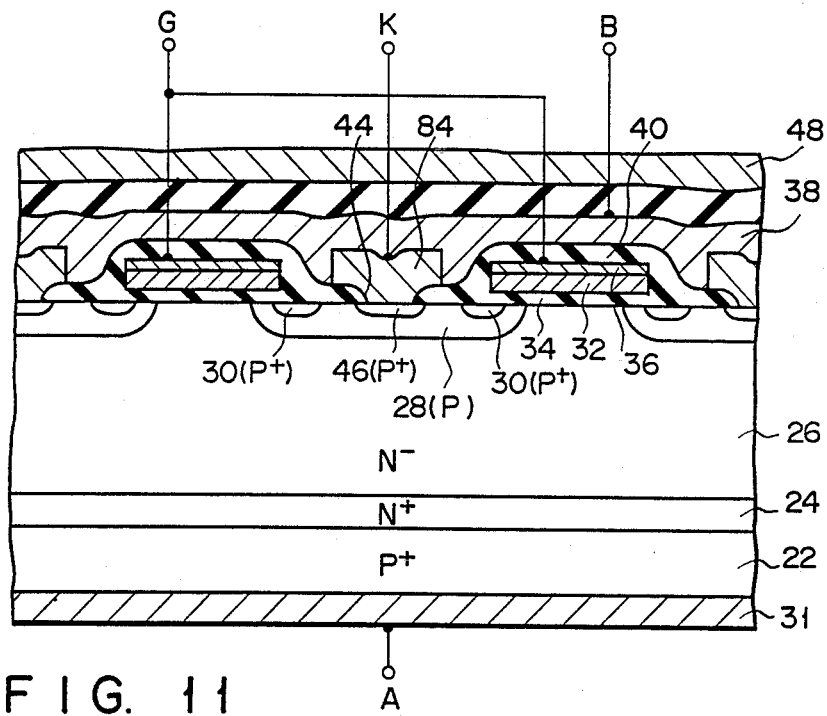
F I G. 11

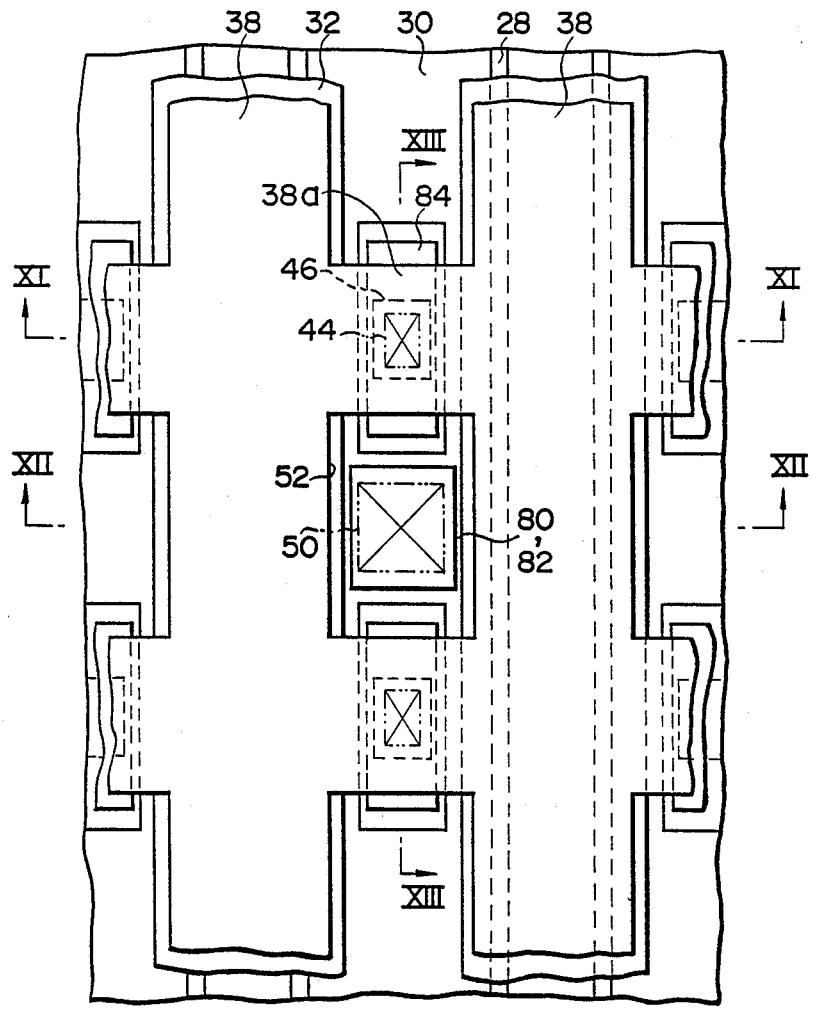
F I G. 10

GATE TURN-OFF THYRISTOR WITH SWITCHING CONTROL FIELD EFFECT TRANSISTOR

BACKGROUND OF THE INVENTION

1. Field of the Invention

The present invention relates to semiconductor thyristor devices and, more particularly, to a gate turn-off thyristor incorporating an insulated gate turn-on controlling transistor (MAGTO thyristor).

2. Description of the Related Art

In a conventional gate turn-off thyristor capable of self turn-off (known as a "GTO thyristor"), a control electrode is provided on a P type base layer to turn off the thyristor by partially discharging an anode current from the electrode as a base current. Typically, such a control electrode comprises elongated conductive layers alternately arranged between and parallel to parallel elongated thyristor gate electrode layers on a substrate.

With such a structure, however, the wiring resistance of the control electrode cannot be minimized as required. This degrades the efficiency of outflow of the base current from the electrode in the turn-off mode of the thyristor, thereby reducing the turn-off rate of the thyristor. In addition, if the control electrode is micropatterned to have a reduced electrode width (although an interval between neighboring gate electrodes is not much reduced even if the control electrode width is reduced) in accordance with increasing needs for high integration density, the turn-off operation is delayed at an end portion of the control electrode. As a result, in the worst case, the anode current is locally concentrated so as to destroy the device.

SUMMARY OF THE INVENTION

It is therefore an object of the present invention to provide a new and improved gate turn-off thyristor which is superior in highly-integrated fabrication and turn-on/off driving performance.

In accordance with the above object, the present invention is addressed to a specific thyristor device which comprises a first emitter layer of a first type conductivity, a first base layer of a second type conductivity electrically connected to the first emitter layer, a second base layer of the first type conductivity formed in the surface of the first base layer, a second emitter layer of the second type conductivity formed in the second base layer, and a gate electrode insulatively provided, above that portion of the second base layer which is sandwiched between the second emitter layer and the first base layer, and having an elongated planar shape. A control electrode is electrically connected to the second base layer and turns off the thyristor in response to a turn-off controlling voltage signal externally supplied thereto. The control electrode comprises a first electrode portion insulatively provided above the gate electrode and having an elongated planar shape and a second electrode portion electrically connecting the first electrode portion with the second base layer, and has a mesh-like planar pattern as a whole.

The present invention and its objects and advantages will become more apparent in a detailed description of the preferred embodiments to be presented below.

BRIEF DESCRIPTION OF THE DRAWINGS

In the detailed description of preferred embodiments of the invention presented below, reference is made to the accompanying drawings of which:

FIG. 3 is a diagram showing a planar structure of the main part of the thyristor according to the embodiment of FIG. 2;

FIG. 6 is a diagram showing a sectional structure of the above thyristor taken along line VI—VI in FIG. 3;

FIGS. 8 and 9 are diagrams showing a main sectional structure of a modification of the thyristor according to the previous embodiment of the present invention;

FIG. 10 is a diagram showing a planar structure of the main part of a thyristor according to another embodiment of the present invention;

FIG. 11 is a diagram showing a sectional structure of the above thyristor taken along line XI—XI in FIG. 10;

DETAILED DESCRIPTION OF THE PREFERRED EMBODIMENTS

Before explaining embodiments of the present invention, a typical structure of a conventional device will be described below with reference to FIG. 1 for better understanding of the concept of the present invention.

Figure 1:
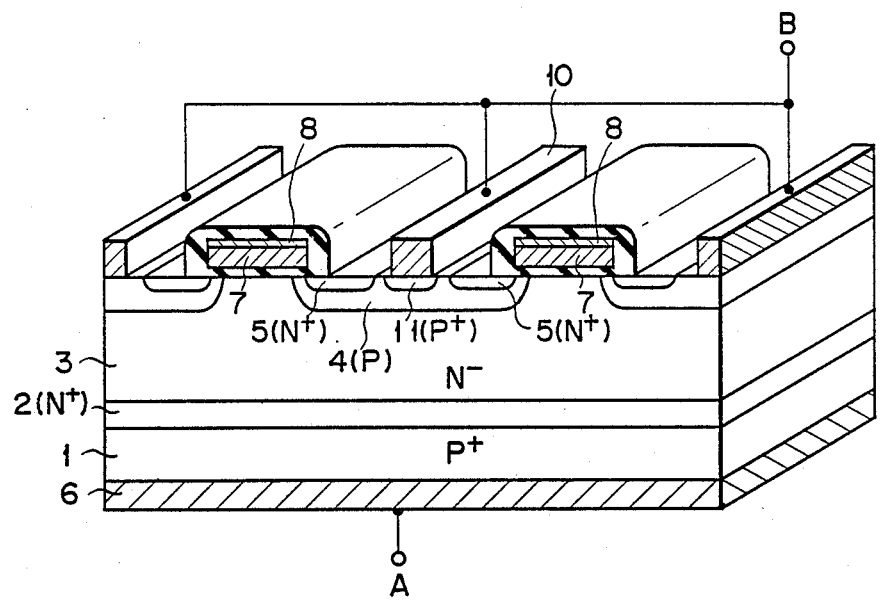
FIG. 1 is a diagram showing a perspective view of a structure of a main part of a conventional MAGTO thyristor.

A MOS assisted gate turn-off thyristor (MAGTO thyristor) capable of self turn-off as shown in FIG. 1 has a multilayered structure comprising heavily-doped P type layer (P+ layer) 1 serving as the first emitter, highly-doped N type layer (N+ layer) 2 serving as a buffer layer, lightly-doped N type layer (N− layer) 3 serving as the first base, P type layer 4 serving as the second base, and N+ layer 5 serving as the second emitter. Elongated P base layer 4 extends into N− base layer 3. Anode electrode 6 is deposited on P+ emitter layer 1.

As shown in FIG. 1, each of the elongated gate electrodes 7 is insulatively provided above N base layer 3 to cover the surface of P base layer 4 positioned between N emitter layer 5 and N base layer 3. Low-resistance metal layer 8 is formed on each gate electrode 7. Each elongated portion of control electrode 10 (base electrode wiring) is elongated on the corresponding P base layer 4 to extend parallel to gate electrodes 7. P+ layer 11 is buried in the surface of P base layer 4 in contact with control electrode 10 to improve ohmic contact therebetween. A cathode electrode (not shown) is provided above the layer structure to contact N emitter layer 5.

With such an arrangement, when a voltage having a positive polarity is applied to gate electrode 7, N emitter layer 5 is short-circuited to N base layer 3 through a channel region formed on the surface of P base layer 4 immediately below gate electrode 7. As a result, electrons are injected into N base layer 3. At this time, holes in an amount corresponding to that of the electrons are injected from P emitter layer 1 into N base layer 3. The thyristor is thus turned on. In order to turn off the thyristor, a negative bias voltage is applied to control electrode 10. An anode current flowing to the cathode electrode through layer 5 is partially discharged from electrode 10 as a base current. The thyristor is thus turned off.

In order to improve the on/off switching rate of this thyristor, N emitter layer 5 must be micropatterned to reduce its width. If layer 5 is narrowed, the time required for electrons injected upon turning on to entirely spread by plasma spreading can be shortened to improve the turn-on rate. At the same time, since the resistance of P base layer 4 immediately below N emitter layer 5 is reduced, the base current can be efficiently discharged from electrode 10, thereby improving the turn-off rate.

Width reduction of layer 5, however, leads to reduction in effective conductive area of the thyristor, thereby undesirably increasing the amount of the forward voltage drop. In order to solve the above problem, when the width of N emitter layer 5 is reduced, if the size of the remaining parts are similarly microfabricated, another problem is posed in that the resistances of layer wirings of the gate and control electrodes are undesirably increased. If the width of gate electrode 7 is reduced to increase its wiring resistance, the time interval from application of a turn-on controlling voltage to electrode 7 to formation of the channel region at the end of P base layer 4 is prolonged, thereby reducing the turn-on rate of the thyristor. If the width of control electrode 10 is reduced to increase its wiring resistance, the discharge efficiency of the base current from electrode 10 is degraded to reduce the turn-off rate of the thyristor. Delay in turning off leads to local concentration of the anode current at the end portions of narrow electrode 10. As a result, in the worst case, the device is destroyed.

The above problems can be effectively solved by MAGTO thyristors according to the embodiments of the present invention to be described in detail below.

Figure 2:
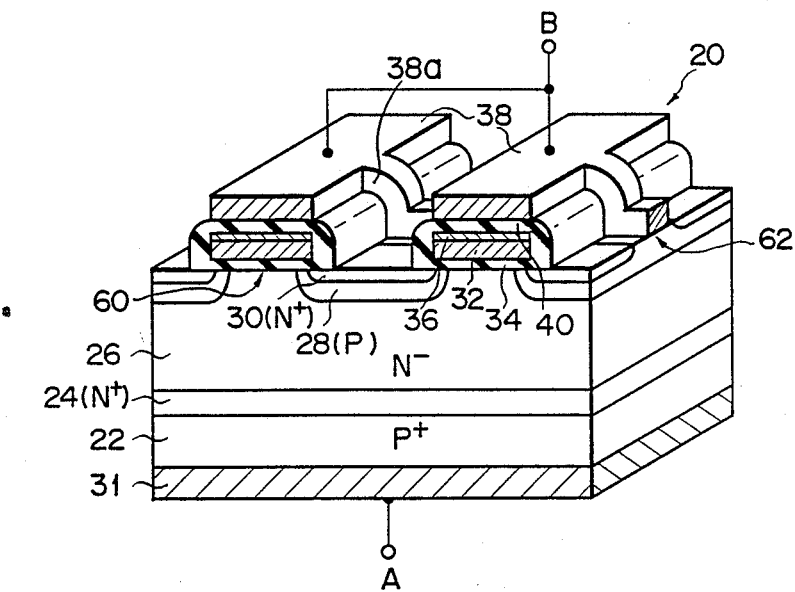
FIG. 2 is a diagram showing a perspective view of a structure of a main part of an MAGTO thyristor according to a preferred embodiment of the present invention.

Referring now to FIG. 2, a MAGTO thyristor according to one preferred embodiment of the present invention is generally designated by reference numeral "20". Thyristor 20 has a so-called "thyristor structure"- comprising heavily-doped P type layer (P+ layer) 22 serving as the first emitter (P emitter), highlydoped N type layer (N+ layer) 24 serving as a buffer layer, lightly-doped N type layer (N− layer) 26 serving as the first base (N base , P type layer 28 serving as the second base (P base), and N+ layer 30 serving as the second emitter (N emitter). P base layer 28 is elongated on the surface of N base layer 26 to extend parallel to each other. N emitter layer 30 is formed in P base layer 28. Anode electrode layer 31 is formed on P emitter layer 22.

Gate electrode 32 is insulatively disposed by gate insulative layer 34 above that surface portion of P base layer 28 which is positioned between N emitter layer 30 and N base layer 26. N emitter layer 30 is self-aligned with gate electrode 32. Low-resistance metal layer 36 is formed on each electrode 32. It should be noted that control electrode (base electrode wiring) 38 is insulatively stacked above the corresponding gate electrode 32 by second gate insulative layer (insulative interlayer film) 40. In this embodiment, elongated control electrode 38 is widened so that its width becomes substantially equal to that of underlying gate electrode 32. As shown in FIG. 2, control electrodes 38 formed above neighboring gate electrodes 32 are connected with each other by connection wiring layer 38a (electrodes 38 are electrically connected to P base layer 28 by wiring layer 38a), thereby providing a mesh-like planar pattern as a whole as shown in FIG. 3. Note that in FIG. 3, a cathode electrode and insulative layers are omitted for the sake of illustrative simplicity. In addition, in order to visually, clearly check an overlapped portion of electrodes 32 and 38, the width of electrode 38 is emphasized.

Figure 4:
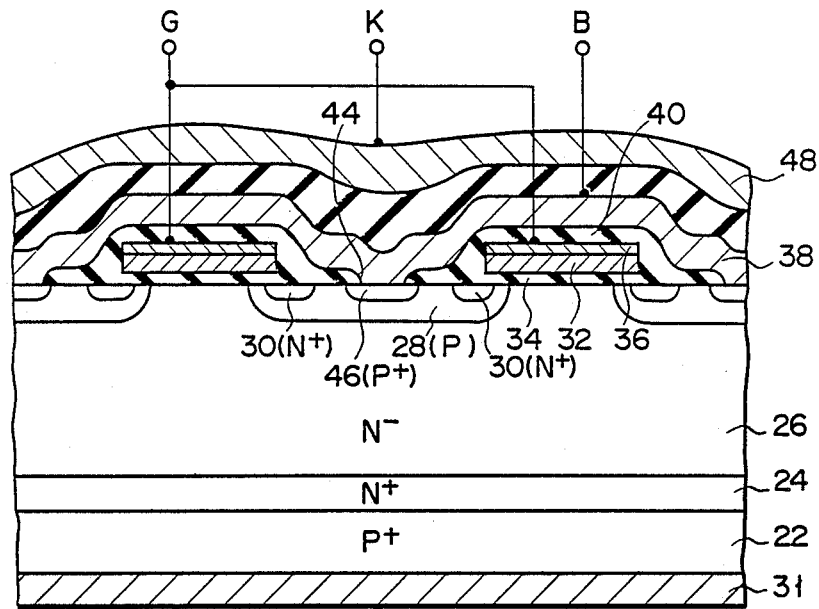
FIG. 4 is a diagram showing a sectional structure of the above thyristor taken along line IV—IV in FIG. 3.
Figure 5:
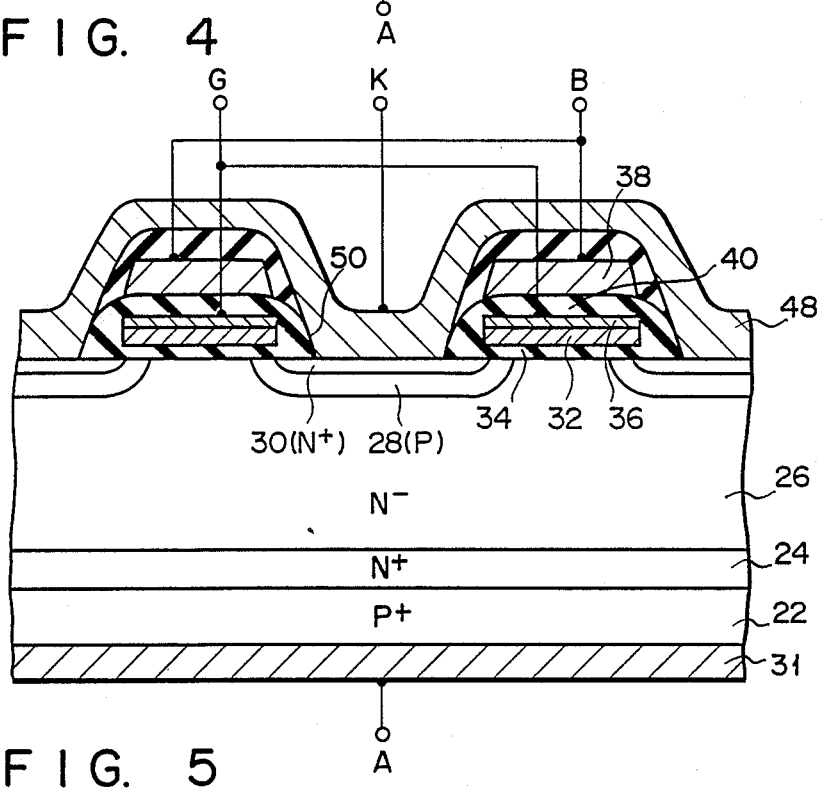
FIG. 5 is a diagram showing a sectional structure of the above thyristor taken along line V—V in FIG. 3.

FIGS. 4, 5 and 6 show sectional structures taken along lines IV—IV, V—V and VI—VI of the thyristor planar structure shown in FIG. 3, respectively. As is most clearly shown in FIG. 4, control gate 38 is connected at its connection wiring layer 38a (see FIG. 2) to P base layer 28 through contact hole 44 formed in gate insulative layer 34. P+ layer 46 is formed in layer 28 to be positioned at a contact portion between control electrode 38 and P base layer 28. This layer serves as a low-resistance layer for reducing the contact resistance between control electrode 38 and P base layer 28. In addition, as shown in FIG. 5 or 6, cathode electrode 48 formed to insulatively cover the thyristor structure is connected to N emitter layer 30 through contact hole 50 formed in gate insulation layer 34. According to this embodiment, contact hole 50 for the cathode electrode is formed at the central portion of opening 52 of control electrode 38 having a mesh-like planar pattern as shown in FIG. 3.

When a negative bias voltage is applied to control electrode 38, an anode current is partially discharged as a base current, to enable self turn-off of thyristor 20. Electrode 38 can serve also as a turn-on control electrode. When a positive voltage is simultaneously applied to gate electrode 32 and control electrode 38, the base current flows to P base layer 28, and turn-on progresses from a channel end of N emitter layer 30 and a control electrode side of N emitter layer 30 (i.e., a conductive region is enlarged) to perform a turn-on operation.

With such an arrangement, since a main portion of switching control electrode 38 is stacked or mounted above the corresponding gate electrode 32, control electrode 38 can be formed to have a desired width, more specifically, a width equal to that of underlying gate electrode 32. Therefore, while the interval between neighboring gate electrodes 32 can be reduced, the wiring resistance of electrode 38 can thus be largely reduced. As a result, the integration density and the turn-on/off rate of thyristor 20 can be improved simultaneously.

Figure 7A:
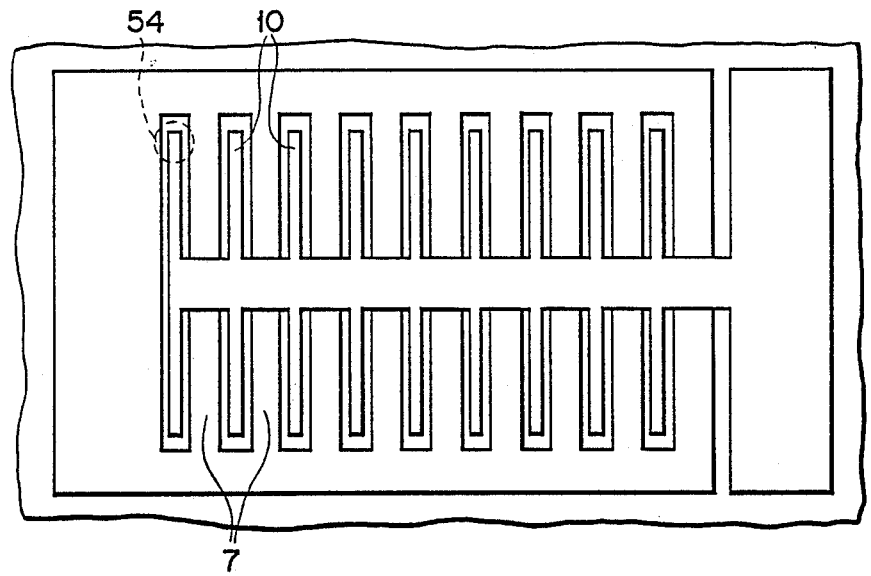
FIG. 7 is a diagram for comparing the planar structures of the conventional thyristor and the thyristor according to the embodiment of the present invention.
Figure 7B:
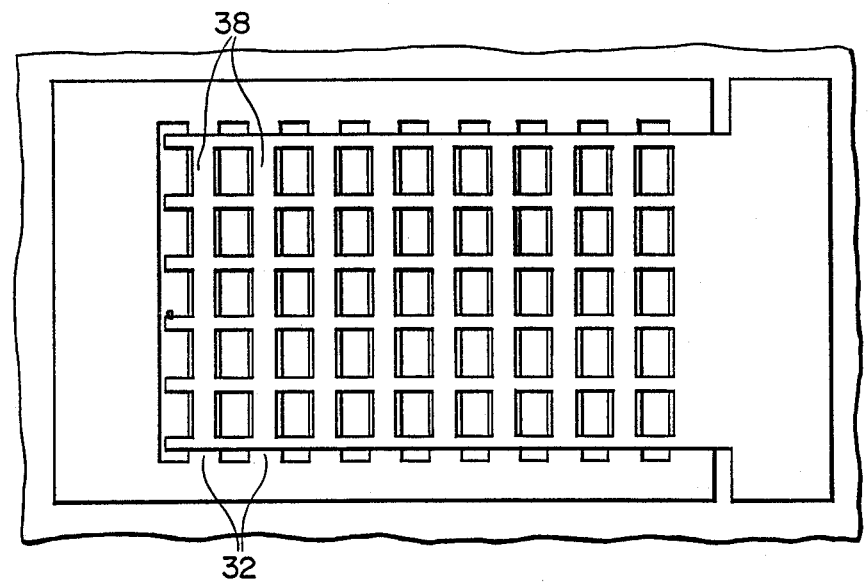
Figure 12:
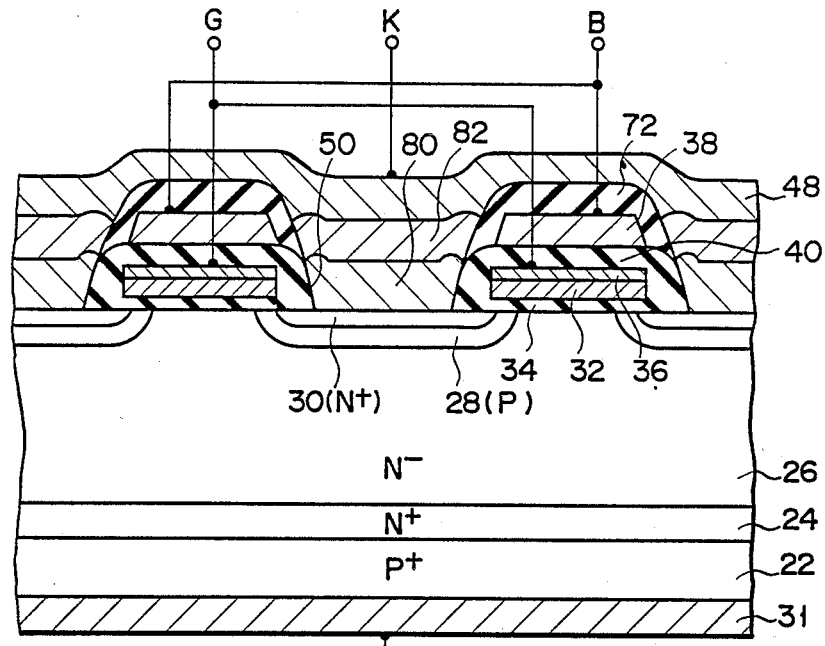
FIG. 12 is a diagram showing a sectional structure of the above thyristor taken along line XII—XII in FIG. 10.
Figure 13:
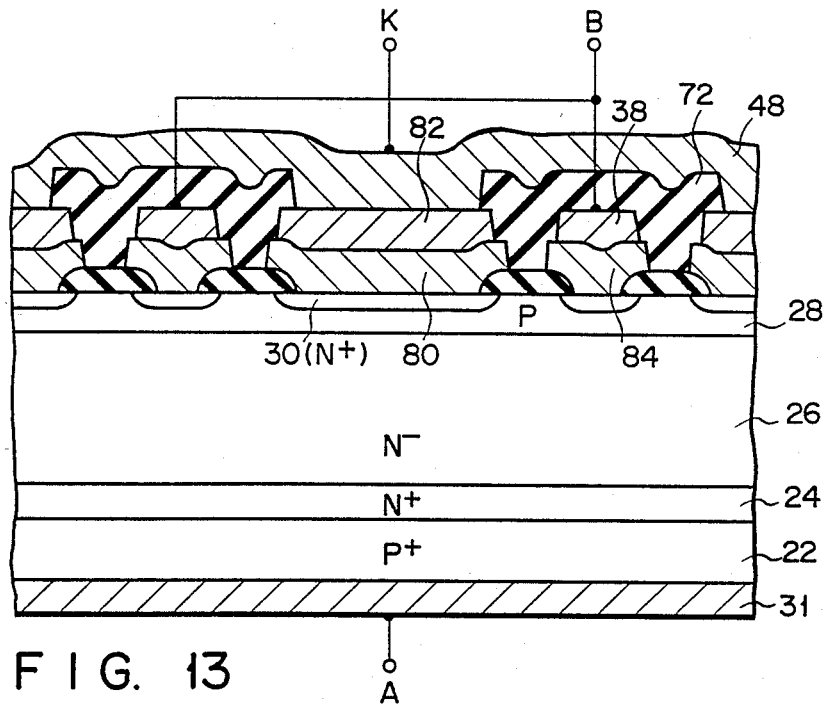
FIG. 13 is a diagram showing a sectional structure of the above thyristor taken along line XIII—XIII in FIG. 10.

As is apparent from a comparison of the entire planar pattern of a conventional thyristor shown in FIG. 7A with that of the thyristor according to the embodiment of the present invention shown in FIG. 7B, the area of electrode 38 of the thyristor having the mesh-like planar pattern according to the present invention is largely increased. Therefore, the wiring resistance of electrode 38 can be reduced. In particular, such a mesh-like pattern of electrode 38 reduces the wiring resistance of a control electrode layer portion extending to be connected to pads of thyristor 20. Therefore, when thyristor 20 is turned off, the base current can be uniformly discharged from electrode 38 with high efficiency throughout the entire surface of a pellet (on which thyristor 20 is formed). As a result, a peak turn-off current of thyristor 20 can be significantly improved. When the conventional thyristor shown in FIG. 7A is turned off, discharge of base current is delayed at an end portion of control electrode 10 designated by broken circle 54 due to its high resistance. As a result, an anode current is locally concentrated, i.e., the above problem is kept unsolved.

Moreover, according to the above embodiment, a MOSFET structure constituted by gate electrode 32 for turning on the thyristor is formed in a specific crosssection which is different from a cross-section in which the gate turn-off thyristor structure is formed. As is clearly shown in the perspective view of FIG. 2, unlike the conventional insulated gate turn-off thyristor shown in FIG. 1 wherein a gate turn-off thyristor structure is formed in a section in which a MOSFET structure for turn-on control is formed, MOSFET structure 90 is formed in a substrate cross-section different from a cross-section in which GTO thyristor structure 62 is formed. With such an arrangement, since control electrode 38 is arranged perpendicularly to a MOSFET channel (or the longitudinal direction of gate electrode 32), the turn-off operation of thyristor 20 starts simultaneously at both ends of N emitter layer 30 perpendicular to the channel. As a result, the conductive region of this thyristor extending perpendicularly to the longitudinal direction of electrode 32 is gradually narrowed and finally disconnected. In this case, the channel region having a comparatively high P base resistance is not used as a discharge path of the base current at all. Therefore, the base current can be efficiently discharged to accelerate a reduction in turn-off current, so that the turn-off rate is improved and the peak turn-off current of thyristor 20 is increased.

A thyristor according to the second embodiment of the present invention shown in FIGS. 8 and 9 has spacer electrode layer 70 formed between N emitter layer 30 and cathode electrode layer 48 in each contact hole 50. In this case, a thyristor sectional view in FIG. 8 corresponds to FIG. 5 (i.e., corresponds to the sectional structure taken along line V—V in FIG. 3), whereas a thyristor sectional view in FIG. 9 corresponds to FIG. 6 (i.e., corresponds to the sectional structure taken along line VI—VI in FIG. 3). In FIGS. 8 and 9, the same reference numerals as in FIGS. 5 and 6 denote the same parts and a detailed description thereof will be omitted.

With such an arrangement, the step-like surface configuration of hole 50 for cathode electrode 48 can be reduced so that aspect ratios of hole 50 can be reduced to be 1.2 to 2.0 and 1.1 to 1.9 in the sections shown in FIGS. 8 and 9, respectively. In the thyristor structure according to the first embodiment not having spacer electrode 70, for example, aspect ratios of contact hole 50 are 2.0 to 3.4 and 1.9 to 3.2 in the sections shown in FIGS. 5 and 6, respectively. As a result, "poor step coverage" in hole 50 of electrode 48 can be reliably prevented in the thyristor having a multilayered structure consisting of gate electrode 32 and control electrode 38. It should be noted that according to this embodiment, spacer electrode 70 is formed simultaneously with control electrode 38 so that its thickness is substantially the same with that of electrode 38. In this case, the width of electrode 38 is set smaller than that of underlying gate electrode 32, thereby preventing insulative layer 72 covering electrode 38 from overlapping electrode 70. If electrode 70 is formed by a manufacturing process independently of that for electrode 38, the thickness of electrode 70 can be further increased, thereby further reducing the aspect ratio of hole 50.

In a thyristor of the third embodiment according the present invention shown in FIGS. 10 to 13, first and second spacer electrode layers 80 and 82 are formed between N emitter layer 30 and cathode electrode layer 48 in contact hole 50. Second layer 82 is stacked on first layer 80. As is most clearly shown in FIG. 11, spacer electrode layer 84 is sandwiched between the substrate surface in which P base layer 28 is formed and control electrode 38 in each contact hole 44. As is most clearly illustrated in FIG. 13, layer 80 for electrode 48 and layer 84 for electrode 38 may be formed to have the same thickness by the same manufacturing process. With such a construction, aspect ratio, defined as the ratio of the depth to the width of the hole of hole 50 can be largely reduced to be 0.4 to 0.7 and 0.3 to 0.5 in FIGS. 12 and 13, respectively, thereby further improving the flatness of the top surface of the thyristor having a multilayered structure consisting of gate electrode 32 and control electrode 38.

Although the invention has been described with reference to specific embodiments, it shall be understood by those skilled in the art that numerous modification may be made that are within the spirit and scope of the inventive contribution.

Figure 14:
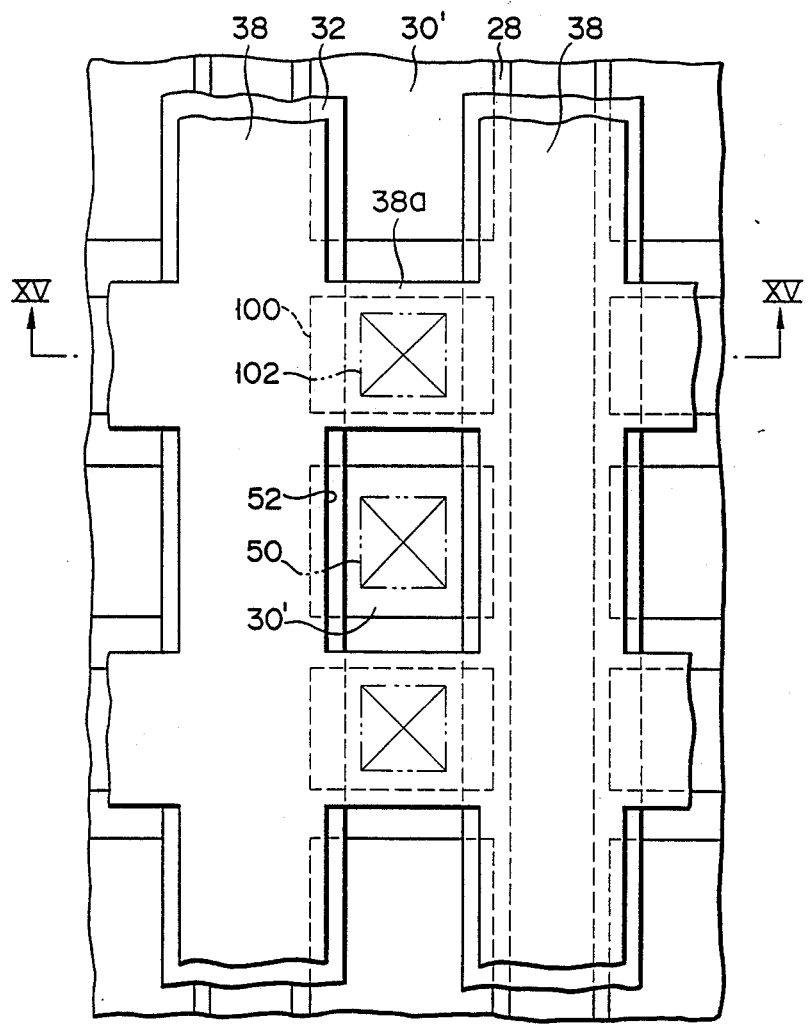
FIG. 14 is a diagram showing a planar structure of the main part of an MAGTO thyristor according to a modification of this invention.

Those portions of N+ source layer 30 may be deleted which are formed in P base layer 28 (see FIG. 4) of the MAGTO thyristor in accordance with the previously described embodiment. The thyristor structure in this case is shown in FIGS. 14 and 15, wherein the similar reference numerals are used to designate the similar parts of the embodiment shown FIGS. 3 to 6 and a detailed explanation thereof will be omitted.

Figure 15:
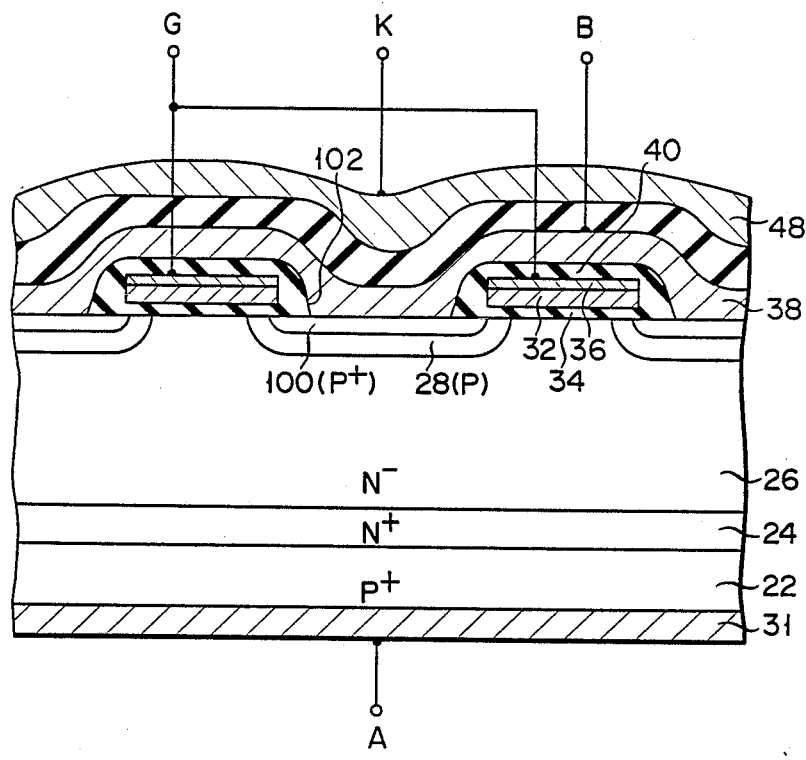
FIG. 15 is a diagram showing a sectional structure of the thyristor taken along line XV—XV in FIG. 14.

As shown in FIG. 15, P+ layer 100 only is formed in P base layer 28 of this MAGTO thyristor. P+ layer 100 corresponds to P+ layer 46 provided in the previous embodiment shown in FIG. 4. P+ layer 100 is formed by impurity implantation with two neighboring gate electrode layers 32 being used as a mask therefor, so that this layer 100 is substantially self-aligned with these gate electrodes 32. Control electrode layer 38 is connected to P+ layer 100 by contact hole 102 which is formed in gate insulation layer 34. The N emitter layer of this thyristor is dispersively formed so that it is divided into a plurality of separate N+ layers 30', whereby contact area 102 between control gate 38 and P+ layer 100 is prevented from being completely surrounded by the N emitter layer on the surface of P base layer 28. N emitter layers 30' are not visible in FIG. 15. The other sectional structures of this thyristor are basically same as those of the embodiment taken along line V—V and line VI—VI shown in FIGS. 5 and 6.

With such an arrangement, since any margin for the positional arrangement between emitter layer 30' and P+ layer 100 on the substrate is not required, the distance between neighboring gate electrodes 32 can be decreased to thereby improve the integration density of the MAGTO thyristor. Furthermore, the interval between N emitter layer 30' and layer P+ 100 on the substrate surface can be increased, thereby making it possible to increase the withstanding voltage between the base and emitter of this thyristor. This leads to the improvement in the turn-off driving ability of the thyristor.

Figure 16:
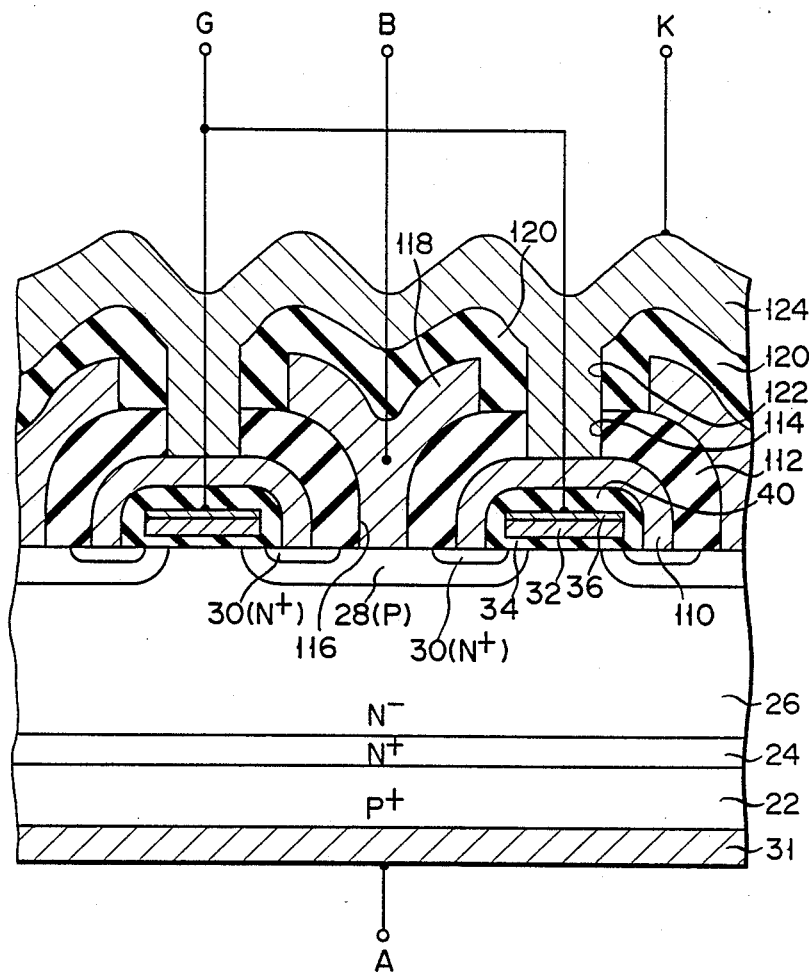
FIG. 16 is a diagram showing a sectional structure of the main part of another MAGTO thyristor.

Another type of electrode wiring structure for MAGTO thyristor is disclosed in Japanese Patent Disclosure (KOKAI) 63-209,173 (raid open on August 30, 1988), according to which each of conductive layers 110 serving as the cathode electrode is formed on the corresponding insulative layer 40 covering gate electrode 32, as shown in FIG. 16. Layer 110 is conducted with those portions of N emitter layer 30 which are formed in P base layers 28. Insulative layer 112 covers cathode electrode layers 110, respectively. Contact hole 114 is formed in each of insulative layers 112. Two neighboring insulative layers 112 define therebetween opening 116, which acts as a contact hole for P base layer 28.

As shown in FIG. 16, conductive layer 118 is formed so that it is stacked on the two neighboring insulative layers 112 and that it is connected to P base layer 28 through contact hole 116 of insulative layers 112. This layer 118 has a letter "Y"-shaped cross-section having the both end portions which overlap the neighboring insulative layers 112. Conductive layer 118 is connected to base electrode terminal B of this thyristor so that it serves as a control gate thereof. Insulative layer 120 covers control gate 118 and has contact hole 122 which forms a straight opening together with contact hole 114. Conductive layer 124 deposited on insulative layer 120 and connected to layers 110 through contact holes 114 and 122. Layer 124 is connected to a cathode electrode terminal K, whereby layers 110 and 124 function as the cathode electrode of the thyristor. With such an arrangement, the cross-sectional area of control electrode 118 can be increased to decrease the base resistivity. The turn-off ability of thyristor can thus be improved. Furthermore, the cathode resistivity can also be decreased, since cathode electrode layer 124 is allowed to be formed on the top position of this thyristor structure with an increased thickness, as required.

What is claimed is:

1. A gate turn-off thyristor comprising:
   (a) a first emitter layer of a first type conductivity;
   (b) a first base layer of a second type conductivity electrically connected to said first emitter layer and having a surface;
   (c) a second base layer of the first type conductivity formed in the surface of said first base layer;
   (d) a second emitter layer of the second type conductivity formed in said second base layer;
   (e) a gate electrode provided to insulatively cover a portion of said second base layer which is positioned between said second emitter layer and said first base layer, said gate electrode having an elongated planar shape;
   (f) a control electrode electrically connected to said second base layer, said control electrode comprising,
   a first electrode portion insulatively provided above said gate electrode and having an elongated planar shape, and
   second electrode portion for electrically connecting said first electrode portion with said second base layer;
   (g) an anode electrode formed to be electrically connected to said first emitter layer; and
   (h) a cathode electrode formed to be electrically connected to said second emitter layer and to insulatively cover said control electrode.

2. The thyristor according to claim 1, wherein said second electrode portion comprises:
   a conductive layer extending perpendicularly to said first electrode portion and formed to extend downward from both sides of said gate electrode to be in contact with said second base layer at a certain surface region of said second base layer.

3. The thyristor according to claim 2, wherein said second emitter layer is substantially uniformly provided in the remaining surface region of said second base layer except for said certain surface region.

4. The thyristor according to claim 3, further comprising:
   a spacer electrode formed on said second emitter layer.

5. The thyristor according to claim 4, further comprising:
   a spacer electrode sandwiched between said second base layer and said control electrode.

6. A gate turn-off thyristor comprising:
   (a) a first emitter layer of a first type conductivity;
   (b) a first base layer of a second type conductivity electrically connected said first emitter layer and having a surface and first and second directions perpendicular to each other on the surface;
   (c) two neighboring second base layers of the first type conductivity formed in the surface of said first base layer with a predetermined interval so as to be elongated along said first direction;
   (d) second emitter layers of the second type conductivity each formed in each of said second base layers;
   (e) a gate electrode insulatively provided above a portion of said second base layer sandwiched between said second emitter layer and said first base layer and having an elongated planar shape extending along said first direction so as to be substantially self-aligned with said second base layers, said gate electrode defining a field effect transistor structure in a section along said second direction which is perpendicular to an extending direction of said gate electrode; and
   (f) a control electrode insulatively provided above said gate electrode to have a planar shape elongated along said first direction, said control electrode having,
   a wiring electrode extending perpendicularly to said control electrode on a plane and formed to extend downward from both sides of said gate electrode to be in contact with certain surface regions of said two neighboring second base layers at certain surface regions of said second base layers, thereby defining a gate turn-off thyristor along said first direction which is parallel to the extending direction of said gate electrode.

7. The thyristor according to claim 6, wherein said control electrode has a mesh-like planar pattern.

8. The thyristor according to claim 7, further comprising:

(g) an anode electrode formed on said first emitter layer; and (h) a cathode electrode formed to be electrically connected to said second emitter layer and to insulatively cover said control electrode.

9. The thyristor according to claim 8, wherein said second emitter layer is substantially uniformly provided in the remaining surface region of each of said second base layers except for said certain surface region.

10. The thyristor according to claim 9, wherein said cathode electrode is brought into electrical contact with said second emitter layers at said remaining surface regions.

11. The thyristor according to claim 10, further comprising:

a spacer electrode sandwiched between said second emitter layers and said cathode electrode.

12. The thyristor according to claim 11, further comprising:

spacer electrode having a double-layered structure.

13. The thyristor according to claim 11, further comprising:

a spacer electrode sandwiched between each of said second base layers and said wiring electrode of said control electrode.

14. A MOS assisted gate turn-off thyristor comprising:

(a) a first emitter layer of a first type conductivity;

(b) a first base layer of a second type conductivity electrically connected to said first emitter layer and having a surface;

(c) second base layers of the first type conductivity elongated in the surface of said first base layer with a predetermined interval;

(d) second emitter layers of the second type conductivity formed in said second base layers;

(e) gate electrodes insulatively provided above said second base layers and each having an elongated planar shape; and (f) a control electrode having, first conductive layer portions insulatively stacked above said gate electrodes to have elongated planar shapes, and second conductive layer portions, extending perpendicularly to said first conductive layer portions on a plane, for connecting said first conductive layer portions with said second base layers at certain surface regions of said second base layers, said first and second conductive layer portions defining a mesh-like planar pattern.

15. The thyristor according to claim 14, wherein the width of said second conductive layer portions is smaller than the width of said first conductive layer portions.

16. The thyristor according to claim 14, further comprising:

heavily-doped semiconductive layers which have the first conductivity type and which are provided in said certain surface regions, said second conductive layer portions being connected by said heavily-doped semiconductive layers to said second base layers, each of said second emitter layers surrounding the corresponding one of said heavily-doped semiconductive layers on a surface of the corresponding second base layer.

17. The thyristor according to claim 14, further comprising:

heavily-doped semiconductive layers which have the first conductivity type and which are provided in said certain surface regions, said second conductive layer portions being connected by said heavily-doped semiconductive layers to said second base layers, said second base layers being dispersively formed so as to prevent each of said heavily-doped semiconductive layers from being surrounded by the corresponding one of said second emitter layers on a surface of the corresponding second base layer.

* * * * *